United States Patent [19]

Garvey et al.

[11] 4,275,809
[45] Jun. 30, 1981

[54] CARD CONVEYOR WITH ROPE BELT DRIVE

[75] Inventors: Francis J. Garvey, Newfield; William F. Buckminster, Vineland, both of N.J.

[73] Assignee: Garvey Corporation, Blue Anchor, N.J.

[21] Appl. No.: 61,867

[22] Filed: Jul. 30, 1979

[51] Int. Cl.³ .................. B65G 29/00; B65G 13/06
[52] U.S. Cl. ............................. 198/624; 198/781; 271/272
[58] Field of Search ............. 198/624, 781, 840; 271/272–274, 264, 238, 240, 314

[56] References Cited

U.S. PATENT DOCUMENTS

| | | | |
|---|---|---|---|
| 3,313,399 | 4/1967 | De Good | 198/781 |
| 4,108,304 | 8/1978 | McKnight | 198/781 |
| 4,174,104 | 11/1979 | Garvey | 271/272 |

FOREIGN PATENT DOCUMENTS 567808  1/1933  Fed. Rep. of Germany .......... 198/790

Primary Examiner—Robert B. Reeves
Assistant Examiner—Brian Bond
Attorney, Agent, or Firm—O'Brien and Marks

[57] ABSTRACT

A card conveyor is disclosed as including a frame with a horizontal top surface supporting two spaced rows of conveyor rollers adapted to engage opposed edges of a card. An endless belt passes along a line tangent to the periphery of each conveyor roller in a row, the belt being pressed against each conveyor roller at its respective point of tangency therewith by a pressure roller which is biased toward the respective conveyor roller, enabling the belt frictionally to drive the conveyor rollers.

2 Claims, 7 Drawing Figures

CARD CONVEYOR WITH ROPE BELT DRIVE

BACKGROUND OF THE INVENTION

1. Field of the Invention

This invention relates to conveyors having a series of rollers individually driven from a common source, to support and transport articles such as printed circuit cards.

2. Description of the Prior Art

The prior art, as exemplified by U.S. Pat. Nos. 2,856,741, 3,078,024 and 3,360,260, discloses conveyors having a series of rollers adapted to convey a particular article, the rollers typically being interconnected by an endless chain or by gears driven from a common source. In many applications, chain or gear drives as provided by the prior art may be objectionable on the basis of initial cost, since a substantial number of relatively expensive sprockets and gears are generally required. These drives may further be objected to for their noise of operation, danger to personnel, and their costs of maintenance. The objectionable features of gear and chain drives can be avoided by using a friction drive belt engaging each roller; however, prior belt driven devices have typically provided an idler pulley between adjacent rollers to cause the belt to flex and follow an arc around part of the circumference of each roller, belt tension being relied on to maintain sufficient normal force between the belt and each roller to avoid slippage. Since belt tension varies with changes in belt length produced by wear and stretching, means must be provided to compensate for changes in belt length, such as biasing the idler pulleys between adjacent rollers laterally against the belt. It has been found, however, that this arrangement of conveyor rollers and biased pulleys may produce undesirably high belt tensions, and that flexing of the belt between rollers reduces belt life.

SUMMARY OF THE INVENTION

The invention is summarized in a conveyor system for cards and the like including a plurality of conveyor rollers aligned in at least one row, a driven belt extending in a line along the conveyor rollers and being in frictional contact therewith for driving the conveyor rollers, and means engaging the driven belt and exerting a normal force thereon at a point opposite each of the conveyor rollers whereby the driven belt is precluded from flexing between adjacent conveyor rollers.

An object of the present invention is to provide a conveyor having a series of driven rollers interconnected by a friction drive belt, wherein sufficient normal force between the belt and each roller is maintained at all times independent of and without affecting the belt's length or tension, and without flexing the belt between rollers.

Other objects, advantages and features of the invention will be apparent from the following description of the preferred embodiment taken in conjunction with the accompanying drawings.

DESCRIPTION OF THE PREFERRED EMBODIMENT

Figure 1:
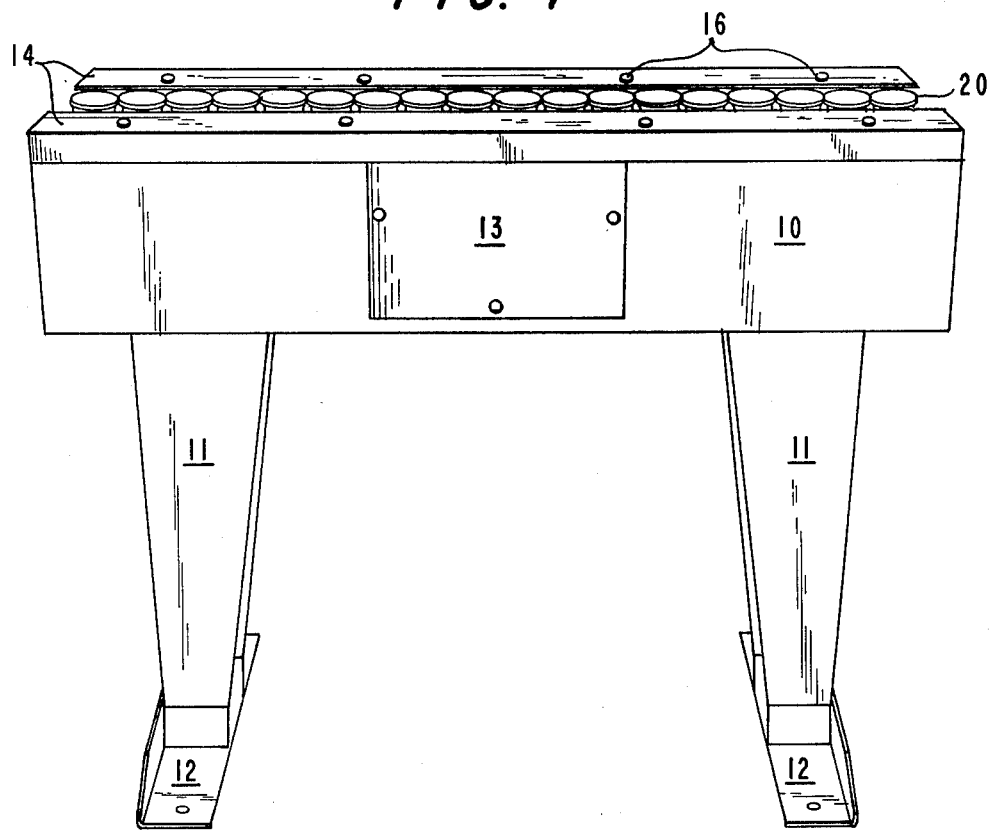
FIG. 1 is an oblique view in perspective showing one side of a conveyor embodying the present invention.

Referring to FIG. 1, the present invention is embodied in a card conveyor which includes an elongate frame 10 made preferably of sheet metal and having a rectangular transverse cross-section. The frame 10 is supported from beneath by a pair of longitudinally spaced legs 11 each having a transverse foot 12. Openings in either side of the frame 10 are covered by removable access panels 13 which mount flush with the frame 10. A pair of transversely spaced top covers 14 are removably attached to a plurality of upstanding posts 15, shown in FIG. 2, by respective fasteners 16.

Figure 2:
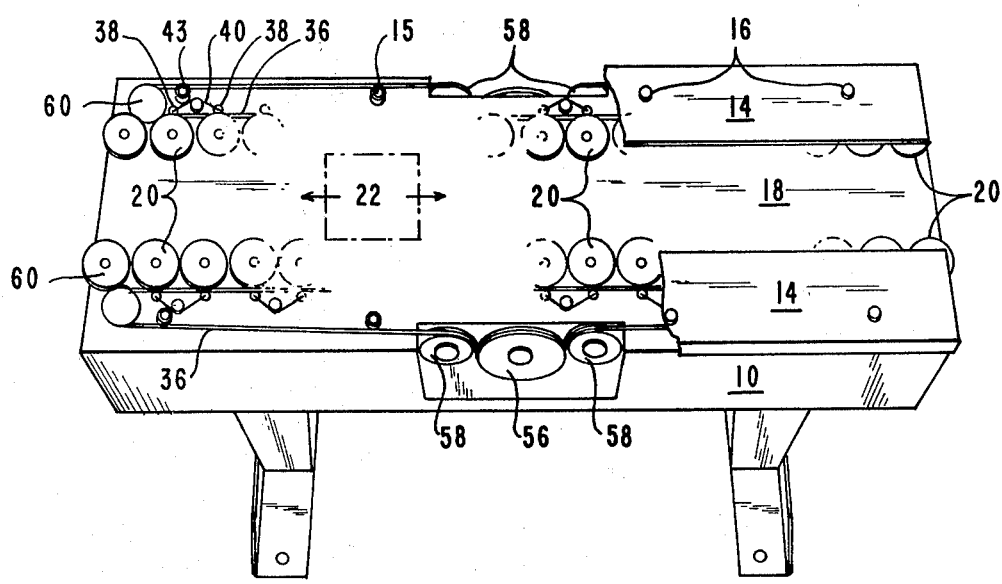
FIG. 2 is an oblique view in perspective of the conveyor shown in FIG. 1, with parts removed.

As shown in FIG. 2, the top surface 18 of the frame 10 supports two parallel rows of longitudinally spaced conveyor rollers 20 adapted to support a card 22 or other object by opposed edges as described hereafter.

Figure 3:
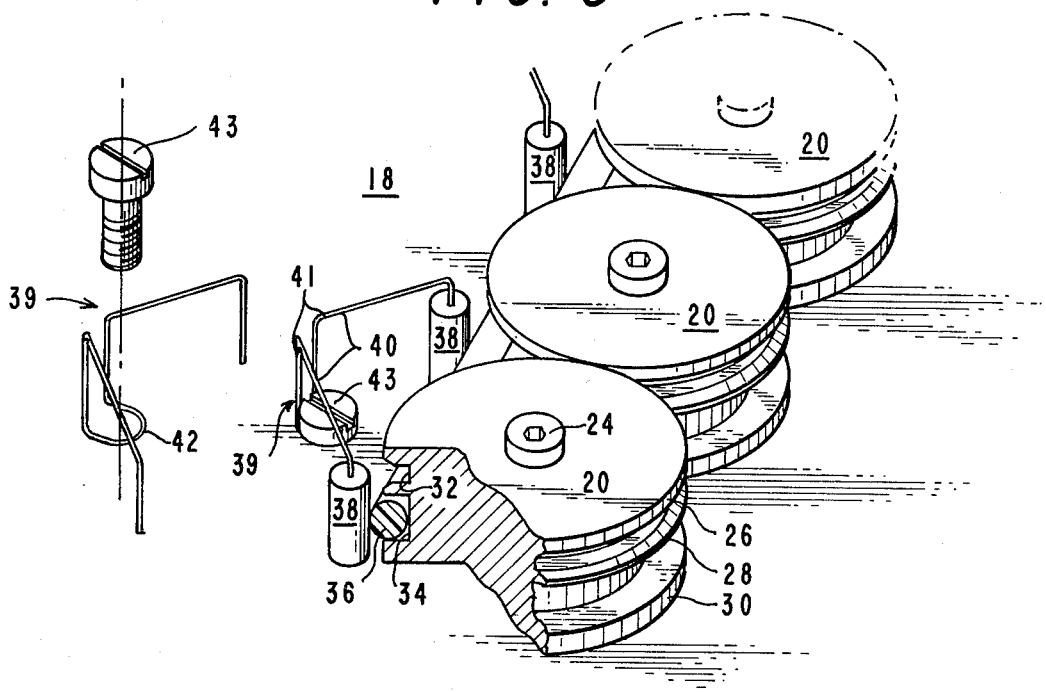
FIG. 3 is a partial isometric view of a portion of the conveyor shown in FIG. 1.

Referring to FIG. 3, each conveyor roller 20 is rotatably secured to the top surface 18 of the frame 10 by a cap screw 24 or other suitable means. The outer surface of each conveyor roller 20 has an upper flange 26, an intermediate flange 28 and a lower flange 30 which define upper and lower grooves 32 and 34 respectively. The upper grove 32 is adapted to engage one edge of a printed circuit card 22 or other article and has a lower edge which is angled slightly downward so as to contact the card 22 only along its edge. The lower groove 34 is adapted to guide a drive belt or rope 36 having a circular cross-section.

As described in greater detail hereinafter, each belt 36 follows an endless path including a straight portion that extends in a line tangent to the periphery of each of the conveyor rollers 20 in a respective row. The belts 36 contact the conveyor rollers 20 only at the points of tangency, and do not extend in an arc around any conveyor roller 20. Therefore there is no contact force between the belts 36 and any conveyor roller 20 resulting from belt tension, and no particular belt tension need be maintained. In order for the belts 36 to turn the conveyor rollers 20, a contact force must exist between the belts 36 and each conveyor roller 20, the magnitude of the contact force required depending on several factors including the coefficient of friction betweenm the materials and the resistance of the rollers 20 to turning under load. To produce the required contact force, a pressure roller 38 is positioned adjacent each conveyor roller 20 (except for the first and last in each row, as shown in FIG. 2), each pressure roller 38 being biased against the side of the belt 36 at its point of tangency with the respective conveyor roller 20.

As shown in FIG. 3, an adjacent pair of pressure rollers 38 are rotatably attached to a single spring support 39, a row of spring supports 39 extending parallel to each row of conveyor rollers 20 as shown in FIG. 2. Each spring support 39 is preferably formed from a length of steel spring wire and includes a pair of horizontal arms 40 extending from respective upright portions 41 which in turn extend from either end of a horseshoe-shaped arcuate portion 42. Each spring support 39 is held fast to the upper surface 18 by a screw 43 or other fastener which engages the arcuate portion 42. In its installed position, each spring support 39 is deflected by contact between its pressure rollers 38 and the belt 36, the resistance of the spring support 39 to this deflection providing the required contact force between the pressure rollers 38, the belt 36 and the conveyor rollers 20 as discussed in the preceding paragraph.

Figure 6:
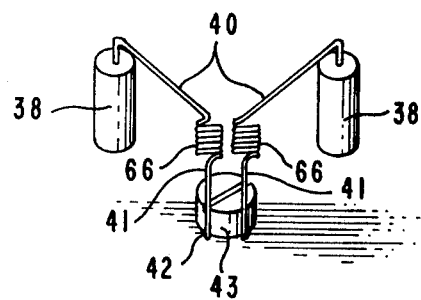
FIG. 6 is an oblique view of a portion of the conveyor, showing an alternative embodiment of the invention.
Figure 7:
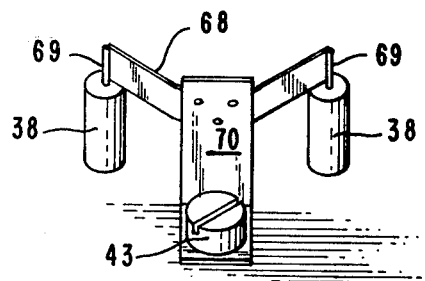
FIG. 7 is an oblique view corresponding to FIG. 6, showing another alternative embodiment of the invention.

Alternative means for biasing the pressure rollers 38 against the belts 36 are shown in FIGS. 6 and 7. In FIG. 6, a pair of coil springs 66 interconnected by an arcuate portion 42 are secured to the upper surface 18, each coil spring 66 having an arm 40 extending from the upper end thereof, with a pressure roller 38 rotatably attached to the end of each arm 40. In FIG. 7, a bracket 70 attached to the upper surface 18 supports a leaf spring 68, each end of which has a pin 69 affixed thereto to rotatably support a pressure roller 38. Either embodiment is installed so as to be sufficiently deformed to maintain the desired contact force between the contact rollers 38, the belt 36 and the conveyor rollers 20.

Figure 4:
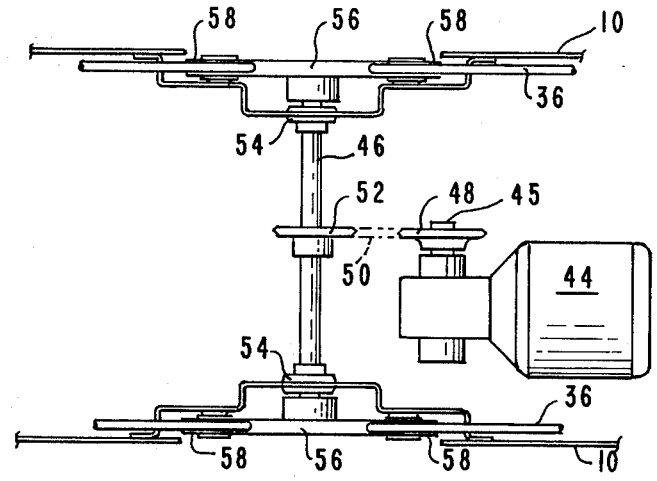
FIG. 4 is a partial top plan view of the conveyor shown in FIG. 1, with parts removed, showing a belt drive mechanism.
Figure 5:
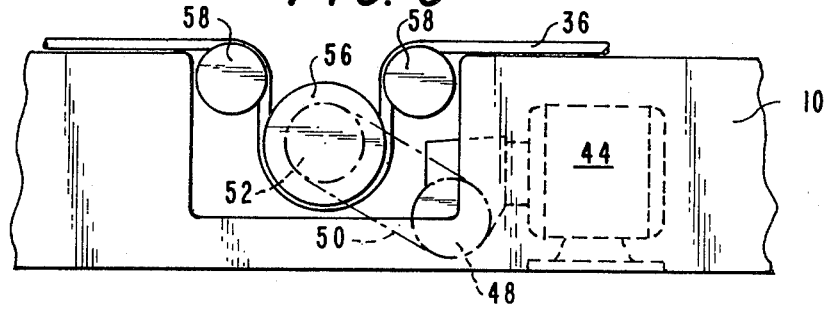
FIG. 5 is a partial side elevation of the conveyor with parts removed.

Referring to FIGS. 4 and 5, a gear reduction motor 44 is attached to the interior of the frame 10, the output shaft 45 of the motor 44 extending horizontally transverse to the length of the frame 10. The motor 44 is connected to an axle 46 by means of a first sprocket 48, a chain 50 and a sprocket 52 attached to the axle 46. A pair of bearings 54 attached to opposite sides of the frame 10 support the axle 46, the ends of which protrude through the bearings 54. A drive pulley 56 having a peripheral groove adapted to carry one of the endless belts 36 is attached to each end of the axle 46. Vertical idler pulleys 58, which rotate in the same plane with a respective drive pulley 56, are attached to the frame 10 above and to each side of each drive pulley 56, the top edges of the vertical idler pulleys 58 extending above the top surface 18 of the frame 10. A horizontal idler pulley 60 is rotatably supported by the upper surface 18 of the frame 10 adjacent the first and last conveyor rollers 20 in each row of conveyor rollers 20. The horizontal idler pulleys 60 are laterally spaced from the respective first and last of the row of conveyor rollers 20 a distance that enables a belt 36 to pass between them while maintaining a compression force on the belt 36 in order that it may turn the first and last conveyor rollers 20.

Each belt 36 passes around its drive pulley 56, over each vertical idler pulley 58, and then to the respective horizontal roller pulleys 60, between which each belt 36 extends in a straight line tangent to each conveyor roller 20, the belt 36 being forced against each conveyor roller 20 at its point of tangency by a respective pressure roller 38 as heretofore described. In this matter, the belts 36 frictionally engage all of the conveyor rollers 20. The drive pulleys 56 and the vertical idler pulleys 58 are normally covered by the access panels 13 on either side of the frame 10, to protect both the mechanism and people working nearby. The top covers 14, which are normally in position on the conveyor, conceal and contain the drive belt 36, the horizontal pulleys 60, the pressure rollers 38 and a majority of each conveyor roller 20, providing safety from injury while allowing full access to a card 22 moving along the conveyor.

Means not shown may be provided to allow adjustment of the distance between the rows of conveyor rollers 20, such as by forming the frame 10 in longitudinal halves adapted for relative lateral movement.

In operation, appropriate circuitry (now shown) activates the motor 44, which drives the axle 46 and the attached drive pulleys 56 via the chain 50 and the sprockets 48 and 52. Referring to FIG. 2, each drive pulley 56 engages an endless belt 36 and drives it around the path defined by the roller pulleys 58 and 60. Between longitudinally opposed horizontal idler pulleys 60, each belt 36 passes along a row of conveyor rollers 20 and is forced against each conveyor roller 20 by a pressure roller 38. Because of this force, the belts 36 frictionally rotate all of the conveyor rollers 20 at the same speed.

A card 22, inserted into the conveyor so as to rest in the upper grooves 32 of the pair of rows of conveyor rollers 20, is propelled along the conveyor by the rotating conveyor rollers 20 either until the motor 44 is stopped or until the card meets an obstruction as, for example, a backup of cards in the system. Since the card 22 is supported only by its edges, continued rotation of the conveyor rollers 20 while the card 22 is stopped does not damage the card surface.

The belt drive provides a quiet and safe construction without the initial costs and maintenance burdens of other conveyor drive mechanisms. The only chain drive in the conveyor is safely located within the frame 10, and all of the other moving parts are protected by the access panels 13 and the top covers 14 so that the machine can be worked around in safety. In the event a foreign object should interfere with rotation of the rollers, the friction drive arrangement allows the obstructed roller to stop, minimizing the risk of injury to both the object and the conveyor mechanism.

An advantage of the conveyor described is that any of the conveyor rollers 20 can readily be changed from a driven roller to a freewheeling roller simply by removing its associated pressure roller 38, with no effect on the other conveyor rollers 20. Similarly, the biasing force of the spring supports 39 can be varied, completely independently, from roller to roller as the application may require.

Since the invention is subject to many variations, modifications and changes in detail, it is intended that all matter contained in the foregoing description or shown in the accompanying drawings shall be interpreted as illustrative and not in a limiting sense.

What is claimed is:

1. In a conveyor system for cards and the like, the combination comprising
   a planar frame surface;
   a plurality of conveyor rollers rotatably attached to said surface, the conveyor rollers aligned in two parallel spaced rows;
   each conveyor roller having an axis of rotation perpendicular to the frame surface;
   two endless belts, each extending tangent to each conveyor roller in a respective row;
   means for driving said belts in the same direction;
   each of the conveyor rollers having an upper circumferential groove to receive an edge of a card being conveyed and a lower circumferential groove for receiving the respective endless belt;
   a plurality of pressure rollers suspended above the frame surface, each roller being rotatable around an axis perpendicular to the surface;
   there being one pressure roller adjacent each conveyor roller;

each of the pressure rollers having a smooth cylindrical surface;

means for biasing each pressure roller toward its respective conveyor roller with sufficient force to preclude belt slippage;

said biasing means including an independent support for each respective pressure roller, each support being attached to said frame surface;

at least a portion of said support being resilient;

each pair of adjacent supports being fastened to said frame surface at a single point;

each pair of adjacent supports being formed from a single piece of spring wire defining an arcuate horseshoe-shaped portion attached to the frame surface, a pair of uprights extending from either end of the arcuate portion, and a horizontal arm extending from the upper end of each upright;

a pressure roller being rotatably supported at the opposite end of each arm.

2. The invention as recited in claim 1 further including a coil spring formed as an integral portion of each upright.

* * * * *